United States Patent
Raimondi et al.

(10) Patent No.: US 9,941,905 B2
(45) Date of Patent: Apr. 10, 2018

(54) CODING AND DECODING METHODS WITH DIFFERENTIATED PROTECTION

(71) Applicant: THALES, Courbevoie (FR)

(72) Inventors: Mathieu Raimondi, Toulouse (FR); Benjamin Gadat, Toulouse (FR); Hanaa Al Bitar, Toulouse (FR)

(73) Assignee: THALES, Courbevoie (FR)

( * ) Notice: Subject to any disclaimer, the term of this patent is extended or adjusted under 35 U.S.C. 154(b) by 62 days.

(21) Appl. No.: 15/093,385

(22) Filed: Apr. 7, 2016

(65) Prior Publication Data
US 2016/0308557 A1  Oct. 20, 2016

(30) Foreign Application Priority Data
Apr. 17, 2015  (FR) ..................... 15 00806

(51) Int. Cl.
*H03M 13/00* (2006.01)
*H03M 13/27* (2006.01)
*H03M 13/11* (2006.01)
*H03M 13/15* (2006.01)
*H03M 13/29* (2006.01)
*H03M 13/35* (2006.01)

(52) U.S. Cl.
CPC ... *H03M 13/2792* (2013.01); *H03M 13/1102* (2013.01); *H03M 13/152* (2013.01); *H03M 13/2906* (2013.01); *H03M 13/356* (2013.01); *H03M 13/6522* (2013.01)

(58) Field of Classification Search
CPC ......... H03M 13/2792; H03M 13/1102; H03M 13/152; H03M 13/2906; H03M 13/356; H03M 13/6522
See application file for complete search history.

(56) References Cited

U.S. PATENT DOCUMENTS

| 2002/0150100 A1* | 10/2002 | White ................... H04L 47/50 370/392 |
| 2010/0107033 A1* | 4/2010 | Kuri ................... H03M 13/1102 714/752 |
| 2013/0145231 A1* | 6/2013 | Frayer ................... H03M 13/13 714/763 |

OTHER PUBLICATIONS

S. Sandberg et al., "Design of bandwidth-efficient unequal error protection LDPC codes," IEEE Transactions on Communications, vol. 58, No. 3, Mar. 2010, pp. 802-811, XP011304246.
H. Yang et al., "Low-floor decoders for LDPC codes," IEEE Transactions on Communications, vol. 57, No. 6, Jun. 2009, pp. 1663-1673, XP011262820.
S. Shieh et al., "Concatenated BCH and LDPC Coding Scheme with Iterative Decoding Algorithm for Flash Memory," IEEE Communications Letters, vol. 19, No. 3, Mar. 2015, pp. 327-330, XP011574612.
K. Narayanan et al., "Selective serial concatenation of turbo codes," IEEE Communications Letters, vol. 1, No. 5, Sep. 1997, pp. 136-139, XP011423310.

(Continued)

*Primary Examiner* — Sam Rizk
(74) *Attorney, Agent, or Firm* — Baker & Hostetler LLP

(57) ABSTRACT

A coding method with differentiated protection to protect, with a different protection efficiency, a number of groups of data in a frame to be transmitted. The invention is based for that on the use of a correcting code of the LDPC type concatenated with an algebraic correcting code. The invention also proposes a decoding method compatible with the coding method with differentiated protection.

17 Claims, 6 Drawing Sheets

(56) References Cited

OTHER PUBLICATIONS

H. Mahdavifar et al., "Performance Limits and Practical Decoding of Interleaved Reed-Solomon Polar Concatenated Codes," IEEE Transactions on Communications, vol. 62, No. 5, May 2014, XP011548388.
W. Ryan et al., "Channel Codes, Classical and Modern," Chapter 5: Low-Density Parity-Check Codes, Cambridge University Press, 2009, pp. 201-256.

* cited by examiner

CODING AND DECODING METHODS WITH DIFFERENTIATED PROTECTION

CROSS-REFERENCE TO RELATED APPLICATION

This application claims priority to foreign French patent application No. FR 1500806, filed on Apr. 17, 2015, the disclosure of which is incorporated by reference in its entirety.

FIELD OF THE INVENTION

The present invention relates to the field of digital telecommunications and more specifically the field of the channel coding which targets the use of correcting codes in order to increase the level of redundancy of the information transmitted so as to be able to reconstruct the message initially generated despite the errors introduced during the transmission of this message through an imperfect propagation channel.

The invention relates more particularly to the field of the correcting codes of the LDPC (Low Density Parity Codes) code type or any other type of correcting code that can be represented in the form of a bipartite graph called Tanner graph.

The invention relates to a coding method and a decoding method that make it possible to apply a differentiated protection to the data to be transmitted as a function of different priority levels.

The invention applies advantageously to the satellite radio-navigation standards, or GNSS (Global Navigation Satellite System) standards such as the GPS or Galileo standards.

The GNSS standards define GNSS messages which are transmitted via data frames. Such messages comprise data relating to positioning information such as satellite ephemerides, satellite clock information, service or even integrity data. In the current standards, these data are protected by a simple correcting code which is applied directly to the entirety of a data frame. This method presents the drawback of not allowing for a fine optimization of the trade-off between the bit rate consumed by the addition of the correcting code and the necessary protection level.

In effect, the data transmitted in a GNSS frame are of diverse kinds and can be classified into a number of groups having different priority levels. Priority level should be understood here to mean a level of priority on the criticality of the data to be transmitted. Some data are more important than others and therefore require a greater level of protection by correcting coding to ensure that they are correctly transmitted with a level of reliability compatible with the priority level.

The invention can be applied similarly to other data transmission systems for which it is possible to group together the data into a number of sets having different priority levels.

The invention proposes a coding method with differentiated protection which makes it possible to protect, with a different protection efficiency, a number of groups of data in a frame to be transmitted.

For that, the invention is based on the use of a correcting code of the LDPC type concatenated with an algebraic correcting code.

The invention also proposes a decoding method compatible with the coding method with differentiated protection.

The methods according to the invention are advantageously applicable to data transmission systems for which the data are formatted as frames of short durations, typically of the order of a few hundred bits. In particular, the invention applies to the protection of data transmitted in a GNSS system.

SUMMARY OF THE INVENTION

The subject of the invention is a coding method with differentiated protection applied to a frame comprising a set of bits, the coding being performed at least from a first systematic correcting code of the LDPC code type, represented by a bipartite graph, called Tanner graph, comprising a plurality of first nodes, called variable nodes, said graph further comprising a plurality of second nodes, called check nodes, each variable node being connected to at least one check node by a branch, the number of branches linked to a variable node being called degree of the variable node, in which each variable node is associated with a bit of a word of said first code, the variable nodes associated with the systematic bits of the word of the first code being called systematic variable nodes, said method comprising the following steps:

decomposing the frame into a plurality of subframes, each having a different priority level, applying to each subframe obtained, except for the subframe of lowest priority level, a second algebraic correcting code of predetermined efficiency, said efficiency increasing as the priority level of each subframe decreases when the number of subframes is at least equal to three, applying an interleaving of the bits of all the subframes so as to perform a correlation between the systematic variable nodes of said first systematic correcting code, arranged according to the value of their degree, and the bits of each subframe, the subframes being arranged according to their priority level, coding, using the first systematic correcting code, the frame composed of the interleaved bits of all the concatenated subframes.

According to a particular aspect of the coding method according to the invention, the bits of each subframe are correlated with the systematic variable nodes of said first systematic correcting code, arranged in ascending order of the value of their degree according to a descending order of the priority levels of the subframes.

According to a particular aspect of the coding method according to the invention, the bits of each subframe are correlated with the systematic variable nodes of said first systematic correcting code, arranged in ascending order of the value of their degree according to an ascending order of the priority levels of the subframes.

According to a particular aspect of the coding method according to the invention, the first systematic correcting code is constructed such that the proportion of systematic variable nodes of a degree equal to the maximum degree is equal to the ratio between the number of bits of the subframe of highest priority level and the number of bits of a word of said first systematic correcting code.

According to a particular aspect of the coding method according to the invention, the decomposition of the frame into subframes is performed by re-ordering the bits of the frame according to their priority level.

According to a particular aspect of the coding method according to the invention, the priority level of a bit is defined as a function of the criticality of the information associated with the bit, of the weight of the bit or of the refresh frequency of the information associated with the bit.

According to a particular aspect of the coding method according to the invention, the data transmitted in the frame are data of a satellite navigation message generated by a satellite radio-navigation system.

According to a particular aspect of the coding method according to the invention, the second algebraic correcting code is a BCH code.

Another subject of the invention is a decoding method with differentiated protection applied to a coded frame comprising a set of bits coded using the coding method with differentiated protection according to the invention, the decoding method comprising the following steps:

performing a first decoding of the coded frame using a first decoding algorithm of a first systematic correcting code, of the LDPC code type, based on the use of a bipartite graph, so as to obtain a first decoded frame, decomposing the first decoded frame into subframes, each subframe containing the bits corresponding to the systematic variable nodes arranged according to the value of their degree, the subframes being arranged according to their priority level, performing a second decoding of each subframe obtained, except the frame of lowest priority level, using a second decoding algorithm of a second algebraic correcting code of predetermined efficiency, said efficiency increasing as the priority level of each subframe decreases when the number of subframes is at least equal to three.

The decoding method with differentiated protection according to the invention can further comprise a step of concatenation of the subframes in a second decoded frame.

According to a particular aspect of the decoding method according to the invention, the second correcting code is an error correcting and detecting code, said decoding method further comprising the following steps:

during the second decoding of each subframe, detecting whether the subframe is correctly decoded or not,
  if the subframe is correctly decoded,
   i. coding, with said second algebraic correcting code, each decoded subframe to obtain a coded subframe,
   ii. applying a second iteration of the first decoding by specifying, to the decoding algorithm of said first systematic correcting code, a maximum likelihood for the bits of each coded subframe.

According to a particular aspect of the coding method according to the invention, the second algebraic correcting code is a BCH code.

According to a particular aspect of the coding method according to the invention, the decoding of the first systematic correcting code and the decoding of the second algebraic correcting code are performed jointly.

Another subject of the invention is a coding device configured to execute the steps of the coding method with differentiated protection according to the invention, a decoding device configured to execute the steps of the decoding method with differentiated protection according to the invention, a satellite radio-navigation signal transmitter comprising a coding device according to the invention for coding, in a differentiated manner, satellite radio-navigation messages, and a satellite radio-navigation signal receiver comprising a decoding device according to the invention for decoding, in a differentiated manner, satellite radio-navigation messages.

BRIEF DESCRIPTION OF THE DRAWINGS

Other features and advantages of the present invention will become more apparent on reading the following description in relation to the attached drawings which represent.

DETAILED DESCRIPTION

Figure 1:
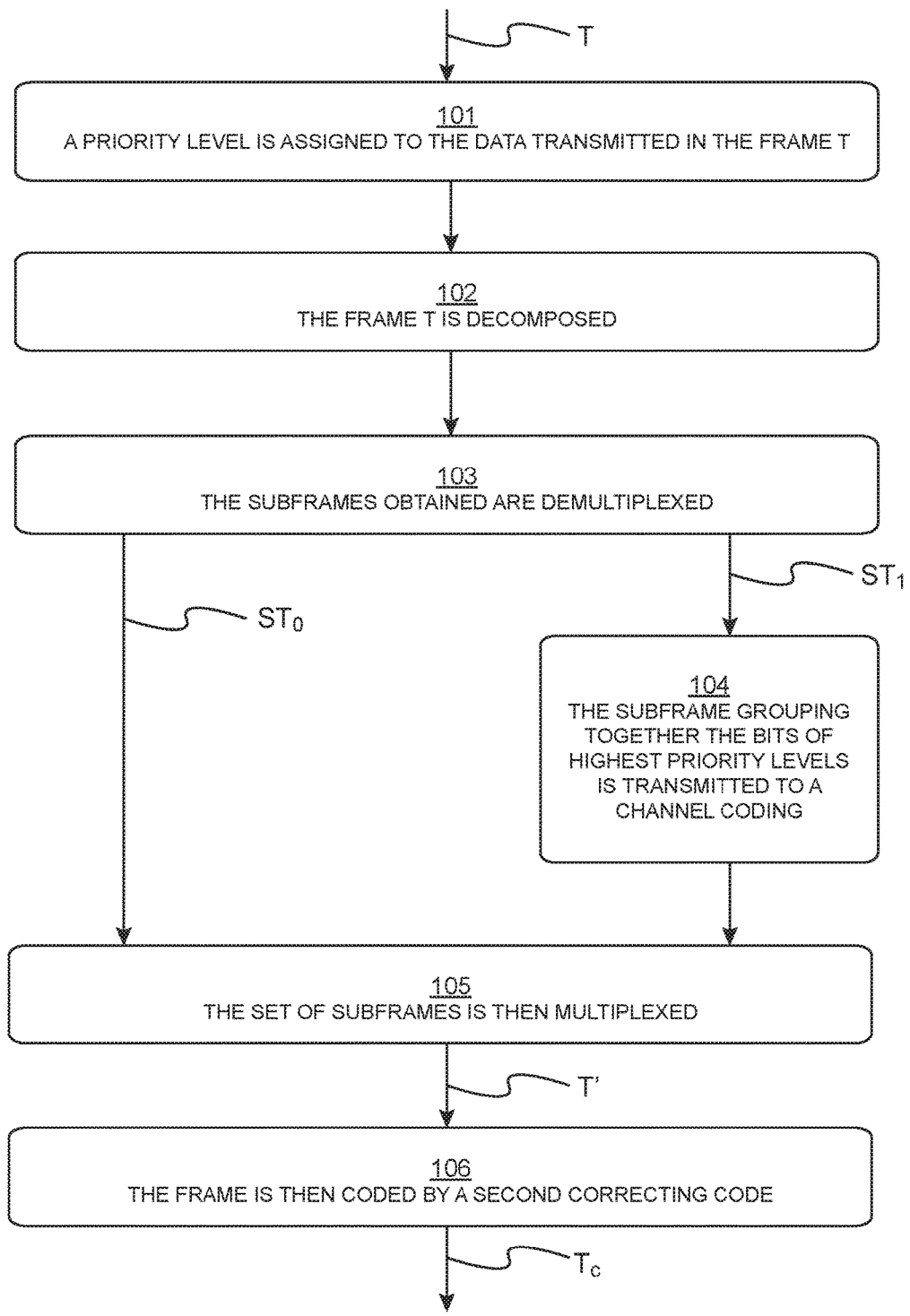
FIG. 1, a flow diagram describing the coding method with differentiated protection according to the invention, FIG. 2, a flow diagram describing the decoding method with differentiated protection according to the invention, according to a first embodiment, FIG. 3, a flow diagram describing the decoding method with differentiated protection according to the invention, according to a second embodiment, FIG. 4, a diagram illustrating the performance levels of the invention in terms of bit error rate and frame error rate as a function of the signal-to-noise ratio, FIG. 5, a block diagram describing the constituent elements of a coder with differentiated protection according to the invention, FIG. 6, a block diagram describing the constituent elements of a decoder with differentiated protection according to the invention, FIG. 7, a block diagram of a transmitter comprising a coder with differentiated protection according to the invention, FIG. 8, a block diagram of a receiver comprising a coder with differentiated protection according to the invention.

FIG. 1 represents a block diagram which describes the sequencing of the steps in implementing the coding method with differentiated protection according to the invention.

The method receives as input a frame T comprising a set of bits and produces at its output a coded frame $T_c$ for it to be transmitted over a radio channel, for example a satellite transmission channel.

According to a first step 101, a priority level is assigned to the data transmitted in the frame T.

The priority level of each bit is chosen as a function of the importance of the information contained in that bit. In other words, a high priority level is assigned to the bits which have to be received as a priority. A high priority level means that the associated bits must be protected by a correcting code of lower protection efficiency in order to increase the level of protection on these bits to thus increase the probability of them being correctly received after transmission through a radio channel.

Conversely, a low priority level can be assigned to the bits which do not require a high probability of correct reception and which can be transmitted without the addition of protection by a correcting code or with a protection using a correcting code of high protection efficiency.

In the context of the application of the invention to a GNSS data frame, the priority level can be assigned to the bits of the frame by taking into account the following constraints. Firstly, the priority level can be set as a function of the type of information to be transmitted. In effect, not all the information to be transmitted has an equal level of criticality.

Secondly, a higher priority level can be assigned to the high-order bits of the quantized data in order to differentiate the protection to be applied as a function of the level of quantization of the data. Conversely, the low-order bits can be associated with a low priority level because they are less significant and do not therefore require a high probability of correct reception.

Finally, some information items are repeated over time with a greater or lesser refresh frequency. A high priority level can be assigned to the information items which are never repeated or are which repeated with a low frequency. Conversely, the information items repeated with a high frequency can be assigned a low priority level.

The examples of assignment of priority levels to the bits of the frame T given above are given in an illustrative and nonlimiting manner. A person skilled in the art seeking to apply the invention to a particular standard will be able to define other strategies for managing priority levels according to the requisite needs. The general idea in the application of the step 101 is to define a high priority level for the bits which require a high probability of correct reception and to define a low priority level for the bits which have fewer constraints on their correct reception rate.

The priority level can be an integer varying over a given range, for example a strictly positive integer between 0 and M, 0 being the lowest priority level and M being the highest priority level.

In a second step 102, the frame T is decomposed into $N_t$ subframes by grouping together, in each subframe, the bits of equivalent priority level. For example, if $N_t$ is equal to two, step 102 consists in grouping together, in a first subframe, the highest priority level bits, and, in a second subframe, the lowest priority level bits. If $N_t$ is greater than two, the bits are arranged as a function of their ascending priority level and $N_t$ subframes are constructed each comprising the bits having an identical or close priority level. The decomposition 102 of the frame T into subframes can be done by setting identical lengths for the subframes or by grouping together, in a subframe, the bits having a same priority level, in which case the subframes can have different lengths.

In a third step 103, the subframes obtained are demultiplexed to be each processed by a first distinct channel coding operation for each subframe. The example of FIG. 1 is limited to the generation of two subframes but can easily be extended to a number of subframes greater than two.

The subframe $ST_0$ grouping together the bits of lowest priority levels is not subjected to any channel coding operation initially and is directly transmitted to a multiplexing step 106.

The subframe $ST_1$ grouping together the bits of highest priority levels is transmitted to a channel coding step 104 which consists in applying to the subframe $ST_1$ an algebraic correcting code, for example a BCH correcting code.

If a number $N_t$, greater than two, of subframes is generated, an algebraic correcting code of BCH code type is applied to the $N_t-1$ subframes comprising the bits of highest priority levels. Each correcting code is applied with a different protection efficiency that increases as the average priority level of each subframe decreases. The subframe of lowest average priority level is transmitted without coding directly to the multiplexing step 106.

By way of example, if three subframes are considered, the coding efficiencies used can be, for example, equal to 0, 2/3 and 3/4, respectively.

The set of subframes is then multiplexed, in a step 105, to reconstruct a frame of the same size as the frame T received as input for the first step 101. This reconstructed frame is then coded, in a step 106, by a second correcting code. The second correcting code is a correcting code of the LDPC (Low Density Parity Code) code type or any correcting code of the same type which can be represented using a bipartite graph called Tanner graph.

The reference work [1], and in particular Section 5 entitled "Low-density parity-check codes", describe in detail the construction and the representation of a correcting code of LDPC type using a bipartite graph called Tanner graph.

A Tanner graph is composed of two types of nodes. A first type of node is called variable node, or even "code-bit node" according to usages. The variable nodes are each associated with a bit of a code word. There are therefore as many variable nodes as there are bits in the code word to be decoded. Each variable node is connected to one or a number of check nodes, or "constraint nodes". The number of check nodes is equal to the number of rows of the parity matrix of the correcting code. The number of variable nodes is equal to the number of columns of the parity matrix. A check node of index i is connected to a variable node of index j if, and only if, the element of the row i and of the column j of the parity matrix of the code is equal to 1. A connection between a variable node and a check node is called a branch. The number of connections starting from a node is the degree of a node.

The correcting code used in the step 106 to code the multiplexed frame must also be a systematic correcting code. This type of code is for example described in Section 6.5.2 of the work [1] which relates to the codes called "Irregular Repeat-Accumulate Codes", also called IRA codes. Such codes have the particular feature of being generated from a parity matrix of the form $H=[H_U\ H_P]$. $H_P$ is a square matrix of size m×m where m is the number of check nodes of the code. $H_U$ is a matrix with m rows and n-m columns, with R=m/n being the efficiency of the code. $H_P$ is a so-called bidiagonal matrix, the form of which is given on page 269, relation (6.4) of the work [1]. As indicated above, the number of variable nodes is equal to the number of columns of the parity matrix H. In the case of systematic IRA codes, it is possible to distinguish the variable nodes associated with the columns of the matrix $H_U$ and the variable nodes associated with the columns of the matrix $H_P$. The latter correspond to the systematic bits of the code word and will hereinafter be called systematic variable nodes. The systematic bits are the useful bits at the input of the coding operation, unlike the parity bits which are the redundancy bits added by the coding operation. Alternatively, the parity matrix H can also take the form $H=[H_P\ H_U]$, the choice of the order between the matrices $H_P$ and $H_U$ being determined by convention.

The description will now return to describing the coding method according to the invention. In an additional step 105, executed after the step 104 and before the step 106, the subframes coded by application of an algebraic correcting code in the step 104 are interleaved using an interleaver, the function of which is to correlate the bits of the coded subframes with the systematic variable nodes of the bipartite graph of the LDPC systematic correcting code. The correlation depends, on the one hand, on the average priority level of the subframe and, on the other hand, on the degree of the systematic variable nodes.

The introduction of the step 105 is based on the observation that the variable nodes with the most connection in a Tanner graph, that is to say the nodes of highest degree, are those for which the bits of the code word associated with these nodes have the greatest probability of being false after the decoding of the code word.

The invention exploits this observation to correlate the bits of the coded subframes and the systematic variable nodes of the Tanner graph of the LDPC code so as to optimize the overall performance levels in decoding the coded frame $T_c$ as output from the coding operation 106 by a systematic correcting code of the LDPC type.

The step 105 thus consists initially in arranging the systematic variable nodes of the Tanner graph of the LDPC code used in the step 106 according to an order, ascending or descending, of their degrees. This step can be performed from the parity matrix H of the code since the systematic variable nodes correspond to the first (or last) n-m columns of the matrix H and the degree of each variable node is given by the sum of the values of the column of the matrix H associated with the variable node.

Secondly, the coded subframes and the non-coded subframe are correlated with the systematic variable nodes of the LDPC code as a function of the average priority level of the subframe and of the degrees of the variable nodes.

To do this, a first strategy consists in associating the subframes of highest priority levels with the systematic variable nodes of lowest degrees. Thus, a higher probability of correct decoding is favoured for the highest priority subframes.

In the example of FIG. 1, the bits of the subframe $ST_1$ coded 104 by the BCH algebraic correcting code are correlated with the systematic variable nodes of lowest degrees. The bits of the subframe $ST_0$ that are not coded are correlated with the systematic variable nodes of highest degrees. The correlation can be performed by an interleaving operation which consists in arranging the bits of each subframe in a frame T' produced at the input of the coding step 106. The indices of the bits of the frame T' correspond to the indices of the systematic variable nodes of the parity matrix of the correcting code of LDPC type. The interleaving or correlation operation can be done using a vector of the same size as the frame T' which contains the indices of the systematic variable nodes arranged in ascending or descending order of the values of their degrees. Any other equivalent implementation of the step 105 can be envisaged.

In order to better explain the operation performed by the step 105, a numerical example is described which is not necessarily representative of a real situation but which makes it possible to understand how to implement the step 105.

It is assumed for the following that the frame T to be coded is demultiplexed into two subframes. The highest priority subframe $ST_1$ contains, after coding 104, 10 bits, and the lowest priority subframe $ST_0$ contains 5 bits. A vector $V_{deg}$ is defined that is of the same size as the frame T' at the input of the LDPC coding step 106. The size of the vector $V_{deg}$ and of the frame T' is, in this example, equal to 15. The vector $V_{deg}$ contains the indices of the systematic variable nodes sorted in ascending order of their degrees. For example, the vector $V_{deg}$ is equal to [5; 1; 15; 6; 12; 8; 14; 3; 7; 11; 2; 4; 9; 13; 10]. The correlation operation 105 then consists in assigning the 10 bits of the highest priority subframe $ST_1$ to the first 10 systematic variable nodes identified in the vector $V_{deg}$, namely the nodes of indices [5; 1; 15; 6; 12; 8; 14; 3; 7; 11]. The 5 bits of the lowest priority subframe $ST_0$ are assigned to the variable nodes of indices [2; 4; 9; 13; 10].

The above description of the step 105 can easily be extended to a number of subframes greater than two.

A second strategy for implementing the step 105 consists, on the contrary, in associating the subframes of highest priority levels with the systematic variable nodes of highest degrees. According to this second strategy, it is considered that the subframes of highest priority levels are already protected by the addition of an algebraic correcting code (step 104) and the aim is to favour, in the second coding step 106, this time the subframe $ST_0$ of lowest priority level which has not been protected by an algebraic correcting code.

Furthermore, this second strategy offers an advantage in the case where the decoding is performed in two iterations as will be explained in more detail hereinbelow in the paragraph associated with FIG. 3.

According to a variant of the second strategy for implementing the step 105, it is possible to construct an LDPC correcting code by setting the number of systematic variable nodes for which the degree is equal to the maximum degree out of the set of variable nodes. For that, a maximum degree value $d_{max}$, a possible typical value being a maximum degree equal to ten, is first of all set. This parameter influences the error floor level in the decoding of the LDPC code but also the signal-to-noise ratio obtained for a given error rate by the decoding algorithm. The higher the maximum degree, the lower the error floor will be, but the higher the signal-to-noise ratio from which the decoding algorithm begins to decode will be.

A proportion of nodes of degree $d_{max}$ is then set, this proportion being exactly equal to the ratio between the number of bits of the coded subframe of highest priority level and the number of bits of an LDPC code word. The proportion of the other variable nodes is defined according to principles well known to those skilled in the art and described in particular in the reference work [1], in Sections 5 and 6. Using known methods, it is possible to generate a parity matrix for the code which is compatible with the constraints set above. In this way, the bits of the subframe of highest priority level will be associated only with systematic variable nodes of degrees equal to the maximum degree.

One advantage of this variant is that it makes it possible to limit the proportion of variable nodes of maximum degrees which makes it possible to improve the error floor on the error rate curve obtained after decoding. In effect, according to this variant, the proportion of variable nodes of maximum degrees is limited to the proportion of number of bits of the coded subframe of highest priority level out of all the bits.

The variant described above can also be envisaged by this time setting the number of systematic variable nodes for which the degree is equal to the lowest degree out of all the variable nodes.

The correlation step 105 makes it possible to generate a frame T' from the different subframes. The frame T' is then coded 106 by an LDPC IRA systematic correcting code according to a coding method known to those skilled in the art, described for example in Section 6.5.2 of the reference work [1].

The choice of the coding efficiencies of the BCH algebraic correcting code or codes and of the LDPC correcting code can be made so as to obtain an overall coding efficiency between the input frame T and the output frame $T_c$ which is equal to a given efficiency.

Figure 2:
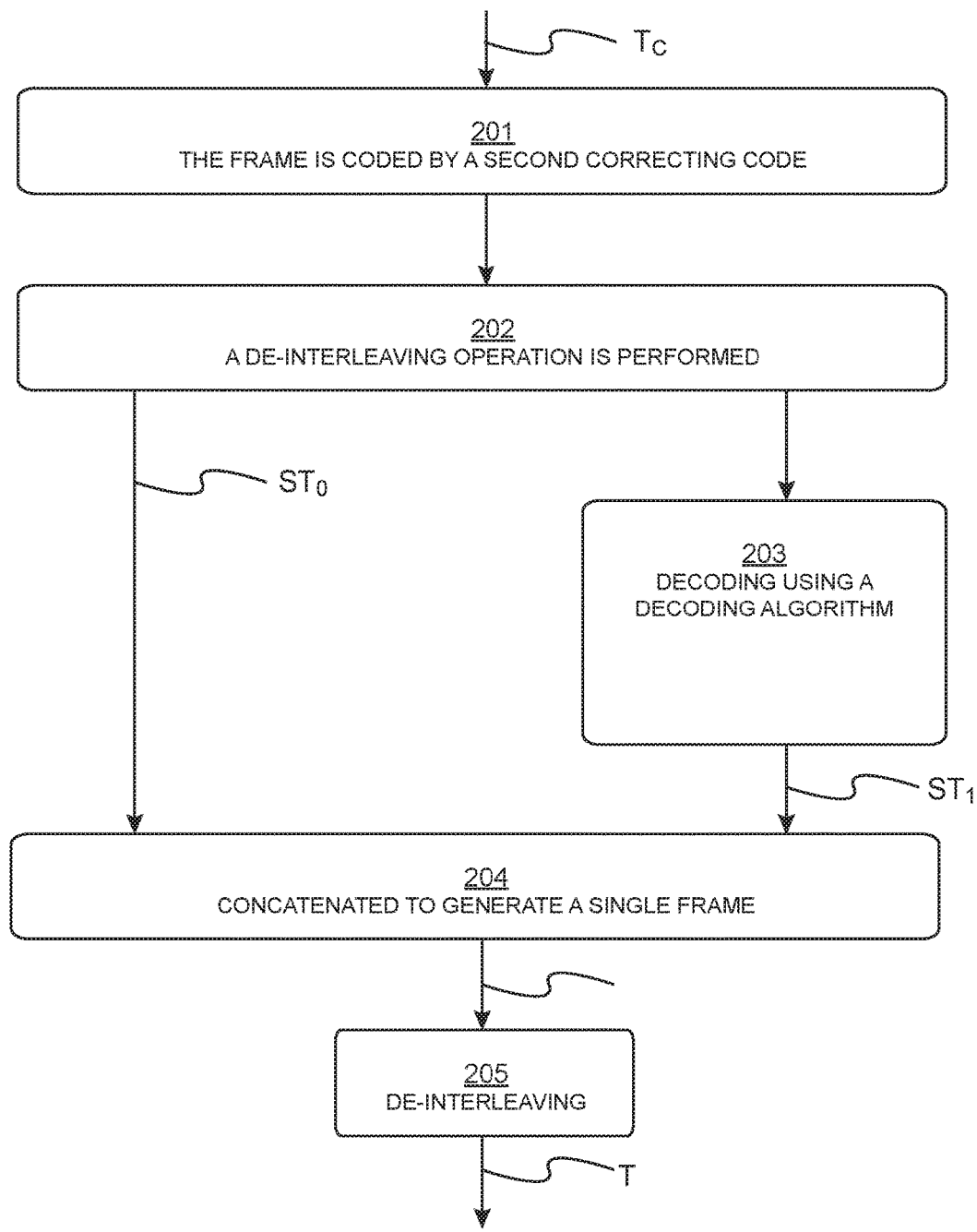

FIG. 2 describes, in a flow diagram, the sequencing of the steps of implementation of a decoding method, according to a first embodiment of the invention, suitable for decoding a frame $T_c$ coded using the coding method described in FIG. 1.

The frame $T_c$ is received as input for the decoding method according to the invention after having been transmitted through an imperfect propagation channel, for example a satellite or radio transmission channel, which potentially generates errors on the bits of the frame $T_c$ when it is received by a receiver.

In a first step 201 of the decoding method, the received frame is decoded using a decoding algorithm of a code of the LDPC type. The decoding algorithm is based on the Tanner graph generated from the parity matrix of the LDPC code chosen to implement the coding method. One possible decoding algorithm can be one of those described in Section 5 of the reference work [1] or any other equivalent algorithm based on a bipartite Tanner graph. Such an algorithm is not described in detail in this document because those skilled in the art, specializing in correcting codes, will know to refer to the work [1] or any other reference work in the field to implement this algorithm.

In a second step 202, a de-interleaving operation is performed on the decoded frame obtained at the output of the first decoding step 201. The de-interleaving operation consists of the reverse operation to that implemented in the step 105 of the coding method. In other words, in the step 105 of the coding method, the interleaving function implemented to correlate the bits of the subframes according to their priority levels with the systematic variable nodes of the LDPC code according to their degrees is saved and transmitted to the receiver responsible for implementing the decoding method according to the invention.

The de-interleaving operation executed by the step 202 produces as output $N_t$ subframes of different priority levels, which correspond to the $N_t$ subframes generated during the coding method. FIG. 2 describes an exemplary scenario for which $N_t$ is equal to two, but the reader will, without difficulty, be able to extend this example to an implementation for a value of $N_t$ greater than two.

Returning to the numeric example described to illustrate the step 105 of the coding method according to the invention, the step 202 consists in generating the subframes $ST_1$ and $ST_0$ as follows. The subframe $ST_1$ contains the bits which have the following indices in the frame at the output of the decoding step 201: [5;1;15; 6; 12; 8; 14; 3; 7; 11]. The subframe $ST_0$ contains the bits which have the following indices: [2; 4; 9; 13; 10].

Each subframe produced at the output of the step 202 is then subjected, apart from the subframe $ST_0$ of lowest priority level, to a decoding step 203 using a decoding algorithm of an algebraic correcting code of BCH code type which consists of the reverse operation of the coding operation performed in the step 104 of the coding method according to the invention. One possible decoding algorithm is, for example, the Berlekamp-Massey algorithm described in Section 3.3.2 of the reference work [1].

The decoded subframes $ST_1$ as well as the subframe $ST_0$ of lowest priority level are then concatenated 204 to generate a single frame and then a final step 205 of de-interleaving is applied to perform the reverse operation to the interleaving operation executed in the step 101 of the coding method according to the invention which aims to order the bits of the frame T to be coded as a function of their priority level.

Figure 3:
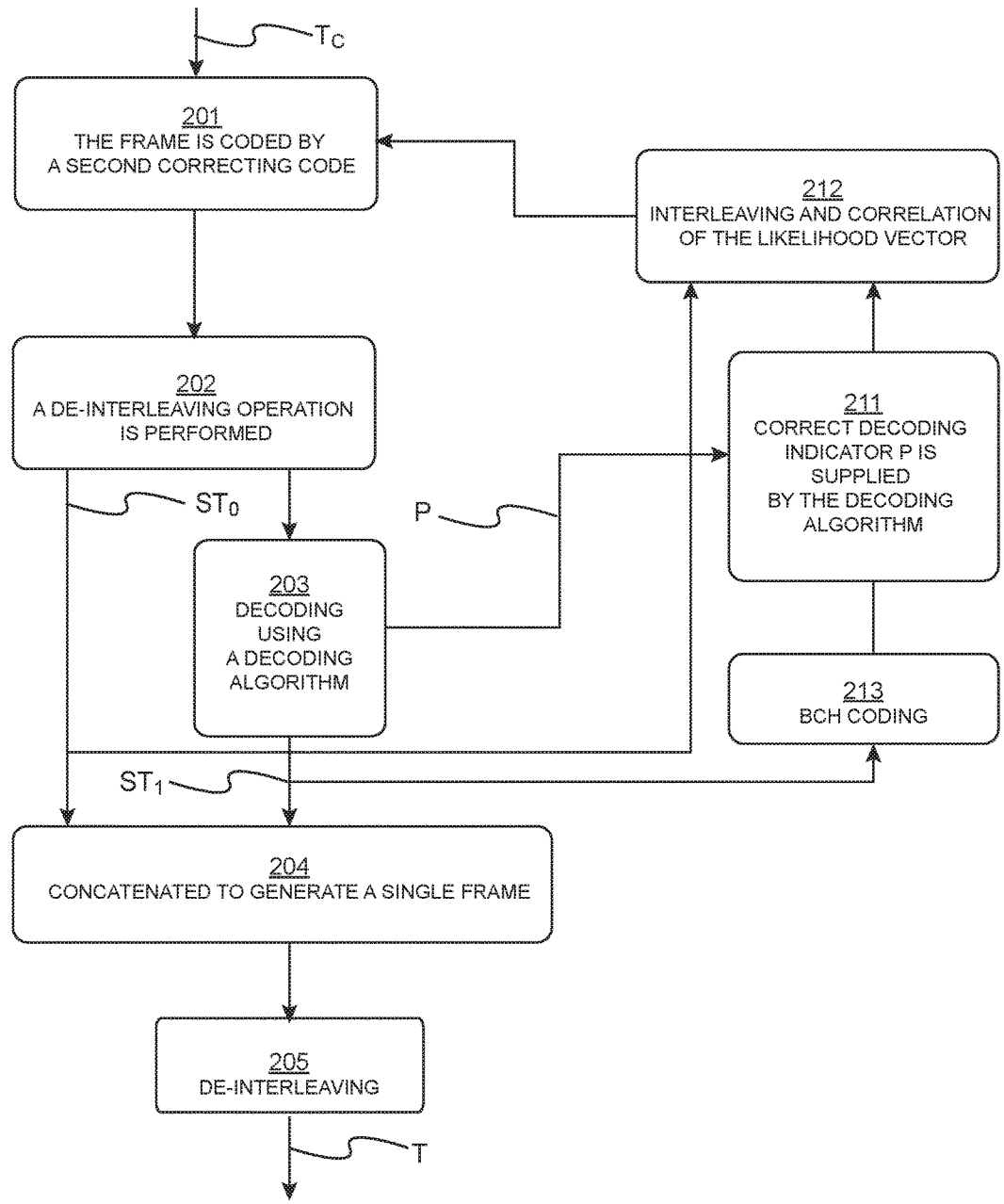

FIG. 3 illustrates, in a flow diagram, a variant of the implementation of the decoding method according to the invention.

According to this variant, the steps 201 to 205 of the decoding method described in FIG. 2 are repeated identically. The algebraic correcting code used to code certain subframes is, in the case of this variant, an error correcting and detecting code which makes it possible to detect whether the subframe has been correctly decoded, that is to say whether it no longer contains errors, or, on the contrary, whether errors remain. P is used to denote the correct or incorrect decoding indicator, obtained on completion of the decoding step 203.

If the correct decoding indicator P is positive, a second decoding iteration is then executed. In this second iteration, the coding step(s) 213 by an algebraic correcting code of the subframe(s) of high priority levels are reiterated identically to the coding step 104 of the method described in FIG. 1.

In an additional step 211, the correct decoding indicator P supplied by the decoding algorithm 203 of the BCH code is used to supply additional information to the decoding algorithm 201 of the LDPC code. This information consists in providing significant reliability, in the second iteration of the decoding 201 of the LDPC code, to the bits which have been correctly decoded by the BCH code. The significant reliability can be introduced by saturating, in the Tanner graph of the LDPC code, with a maximum value, the likelihood information items associated with the bits which have been correctly decoded by the decoding algorithm of the BCH code 203. Thus, this second iteration makes it possible to improve the correction capacity of the decoding algorithm of the LDPC code 201 and in particular on the bits of the subframe $ST_0$ not protected by a BCH code.

In other words, the step 211 consists in providing the decoding algorithm of the LDPC code 201 with a vector of likelihoods of the bits produced as output of the BCH coding step 213 in which the values are saturated with maximum values. For example, if the maximum possible value of a likelihood is equal to 50, the likelihoods supplied in the step 211 are equal to +50 for a bit equal to 1 and to −50 for a bit equal to 0. The term likelihood is well known in the field of correcting code decoding algorithms, it denotes a flexible information item associated with a bit, in other words an information item on the probability of its value. For example, if the likelihood values vary between −50 and +50, the value −50 corresponds to a high certainty that the bit is equal to 0, the value +50 corresponds to a high certainty that the bit is equal to 1 and the intermediate values correspond to less high probabilities. The value 0 corresponds to an equal probability of the bit being at 0 or at 1. Because of the correct decoding information item, it is known that the bits at the output of the BCH coding step 213 are correct, so it is possible to saturate their likelihood values with maximum values as absolute value.

When the BCH decoder 203 does not correctly decode a subframe on the $1^{st}$ iteration, in other words when the indicator P indicates a bad decoding, the $2^{nd}$ iteration of the algorithm is not implemented.

The step 212 of interleaving and of correlation of the likelihood vector (associated with the bits produced by the BCH coding step 213) with the systematic variable nodes of the LDPC code is similar to the step 105 of the coding method described in FIG. 1, the only difference being that the step 212 is limited to replace, in the code word at the input of the LDPC decoding step 201, the values of the bits corresponding to the subframes coded by a BCH algebraic code with the values of the bits obtained at the output of the BCH coding step 213. Similarly, the values of the likelihoods associated with these bits are replaced with the saturated values of the likelihoods calculated in the additional step 211.

The second variant of the decoding method according to the invention, which includes a second decoding iteration, is particularly advantageous when the bits of the subframes of highest priority levels are associated with the systematic variable nodes of highest degrees. In effect, in the second iteration, the bits of the highest priority subframes, which are protected by a BCH code, benefit from a significant reliability because of the correct decoding information supplied by the BCH decoder on the $1^{st}$ decoding iteration. Since these bits are associated with the variable nodes of highest degrees which are the nodes which exhibit a greater probability of error because of their numerous connections, the second decoding iteration will substantially improve the decoding of the lowest priority subframe (that which is not protected by a BCH code) since the latter is associated with the variable nodes of lowest degrees.

If, conversely, the bits of the lowest priority subframe are associated with the variable nodes of highest degrees and the bits of the subframes protected by the BCH code are associated with the variable nodes of lowest degrees, the correct decoding information item supplied by the BCH decoder will improve the reliability on the variable nodes of lowest degrees, which is less advantageous because, naturally, the variable nodes of lowest degrees are less connected and have a lower probability of error than the variable nodes of highest degrees.

According to yet another variant (not described in the figures), the decoding algorithm 203 of the BCH code can be directly incorporated in and merged with the decoding algorithm 201 of the LDPC code.

For that, an overall parity matrix associated with the coding method according to the invention is generated from the respective parity matrices of the BCH code and of the LDPC code. The first rows of the overall parity matrix correspond to the parity equations of the BCH code. The overall decoding algorithm 201 can then be executed directly in the form of a decoding algorithm of an LDPC code.

When the decoding method operates in two iterations, on completion of the first iteration, the parity equations on the part of the parity matrix which corresponds to the BCH code are checked and the syndromes associated with these equations are calculated according to a principle known in the field of the decoding algorithms of BCH codes. If the syndromes are nil, a second decoding iteration is performed in the same way as that described in FIG. 3. That is to say that the steps 213, 211, 212 are applied, before the second LDPC decoding pass. If the syndromes are non-nil, the second iteration is not triggered.

By performing the LDPC decoding and the BCH decoding jointly via a single decoding algorithm, the specific BCH decoding step 203 is eliminated.

Figure 4:
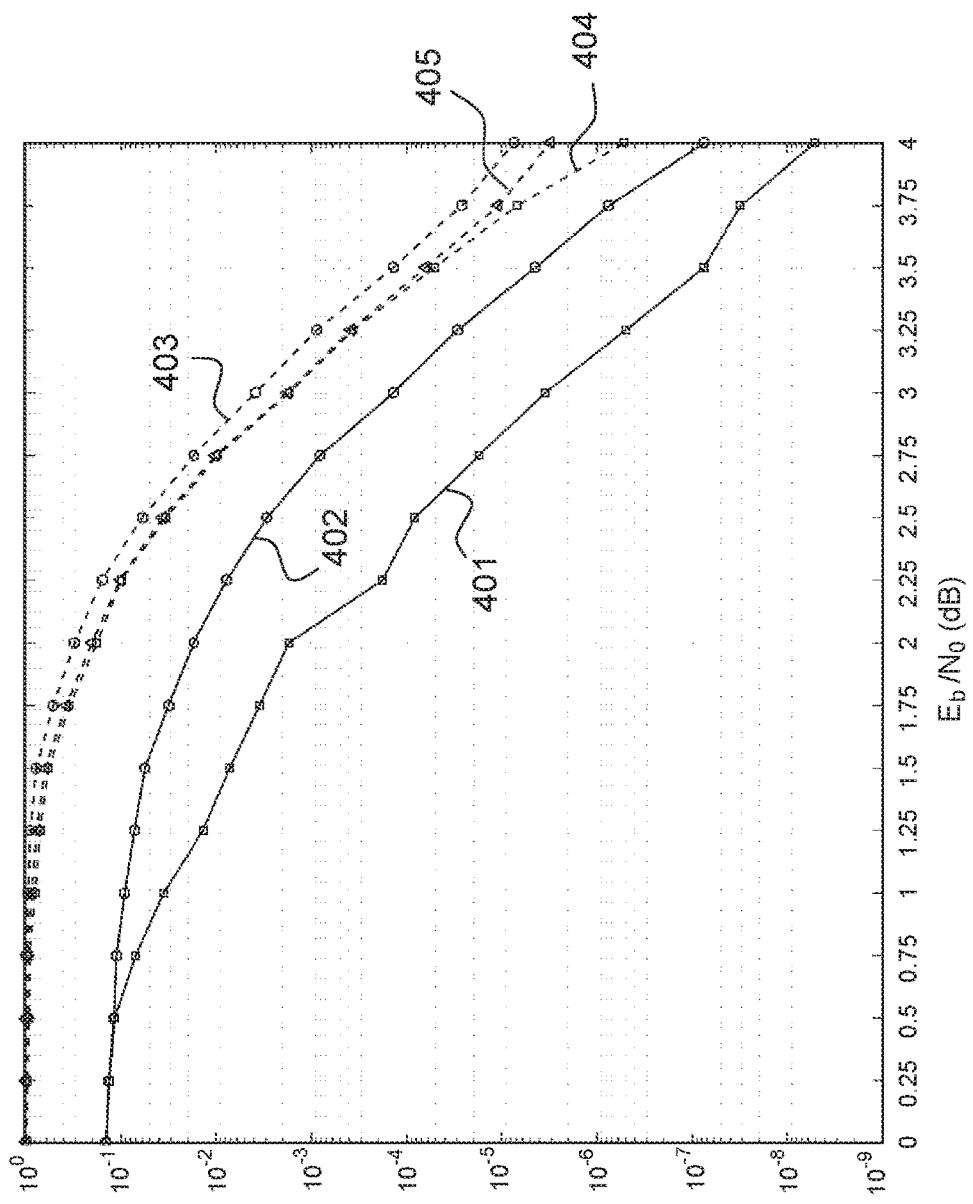

FIG. 4 illustrates the performance levels obtained by virtue of the invention on a diagram representing, on the y axis, the error rate as a function of the signal-to-noise ratio Eb/N0 expressed in decibels. The propagation channel is a simulated channel based on a model of Gaussian additive white noise. The error rate measurement results are obtained for simulations performed over a large number of frames T coded using the coding method according to the invention, subjected to the addition of errors representative of those generated by a propagation channel, then decoded using the decoding method according to the invention. The performance curves of FIG. 4 are obtained for the frames T comprising 300 bits, decomposed into two subframes. The highest priority subframe $ST_1$ is protected by a BCH correcting code of parameters (K,N)=(40,64), with R=K/N being the efficiency of the BCH code. The LDPC code is defined by a generating matrix H with 300 rows and 600 columns. The parameters of the LDPC code are given by the proportions $\lambda_i$ of variable nodes of degrees i: $\{\lambda_1=0.0004; \lambda_2=0.2546; \Delta_4=0.0899; \lambda_7=0.2097; \lambda_{10}=0.4455\}$. The maximum degree is equal to ten. This numeric example is given in a purely illustrative and nonlimiting manner. In this example, the bits of the highest priority subframe $ST_1$ are correlated with the systematic variable nodes of maximum degree.

The curve 401 represents the bit error rate measured after decoding on the highest priority subframe $ST_1$.

The curve 402 represents the bit error rate measured after decoding on the lowest priority subframe $ST_0$.

The curve 403 represents the frame error rate measured only on the lowest priority subframes $ST_0$.

The curve 404 represents the frame error rate measured only on the highest priority subframes $ST_0$.

The curve 405 represents the frame error rate measured only on the lowest priority subframes $ST_0$ with a decoding applied according to the variant embodiment described in FIG. 3 in which a second decoding iteration is performed.

The different curves represented in FIG. 4 make it possible to assess what the invention provides in terms of gain on the signal-to-noise ratio obtained for a given error rate. In particular, it is noted that the error rate (bits or frames) on the highest priority subframes is improved compared to the error rate on the lowest priority subframes. Furthermore, the addition of a second decoding iteration makes it possible to bring the error rate on the last class of lower priority bits substantially to the same level as the error rate obtained on the class of highest priority bits.

Figure 5:
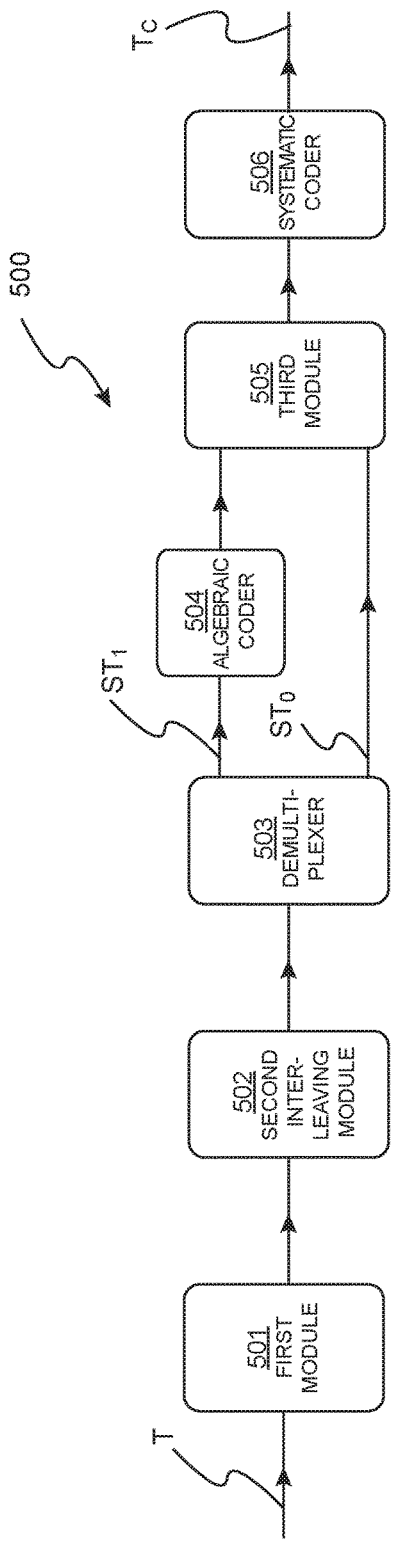

FIG. 5 schematically represents a block diagram of a coder with differentiated protection according to the invention, suitable for implementing the coding method described in FIG. 1.

The coder 500 according to the invention receives as input a frame T of bits to be coded and produces as output a frame $T_c$ of coded bits. The coder 500 comprises different modules configured to execute the steps of the coding method described in FIG. 1. In particular, the coder 500 comprises a first module 501 for assigning a priority level to the bits of the frame T, a second interleaving module 502 for grouping together the bits in groups of equivalent or close priority levels, a demultiplexer 503 for separating the frame T into a number of subframes $ST_0$, $ST_1$, at least one algebraic coder 504 of BCH coder type, a third module 505 for interleaving and multiplexing the subframes and a systematic coder 506 of LDPC coder type.

Figure 6:
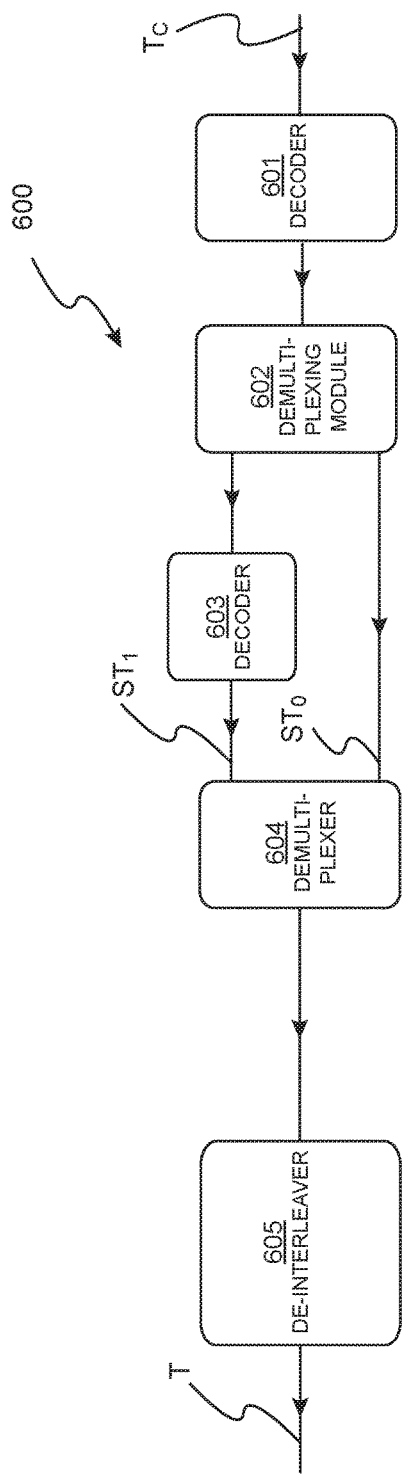

FIG. 6 schematically represents a block diagram of a decoder according to the invention suitable for decoding frames coded by the coder according to the invention described in FIG. 5.

The decoder 600 according to the invention receives as input a frame $T_c$ of coded bits and produces as output a frame T of decoded bits. The decoder 600 comprises different modules configured to execute the steps of the decoding method described in FIGS. 2, and 3. In particular, the decoder 600 comprises a decoder 601 for decoding an LDPC code word, a de-interleaving and demultiplexing module 602 for generating subframes associated with priority levels, at least one decoder 603 for decoding a word of an algebraic code of BCH code type, a multiplexer 604 for concatenating a number of subframes in a single frame and a de-interleaver 605 for reconstructing the initial order of the bits in the original frame.

The decoder 600 can comprise other modules for executing the additional steps described in the variant of the decoding method illustrated in FIG. 3.

The different modules described in FIGS. 5 and 6 are given as exemplary embodiments. Without departing from the scope of the invention, other architectures can be envisaged, for example by grouping together a number of steps of a method within a same module or, on the contrary, by having one step executed by a number of modules.

Figure 7:
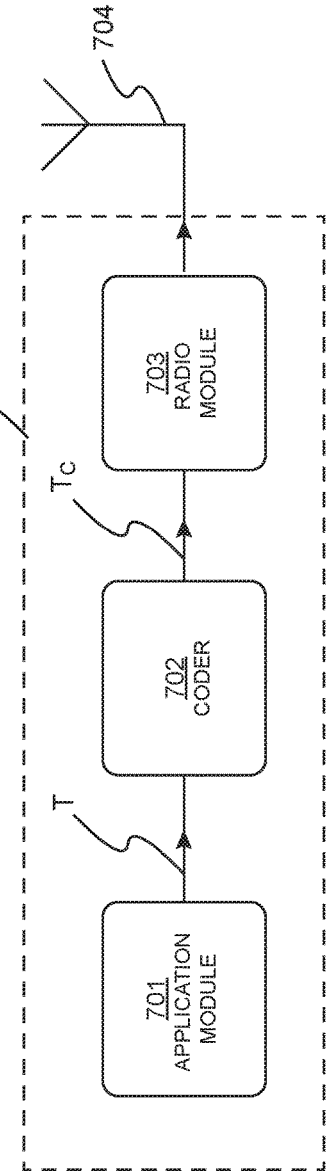

FIG. 7 represents a block diagram of a transmitter 700 comprising a coder 702 according to the invention. The transmitter 700 can further comprise an application module 701 for generating frames of bits T and a radio module 703 for modulating, filtering, formatting and analogically converting a frame of coded bits $T_c$ before its transmission to an antenna 704 to be transmitted over a radio channel. The transmitter 700 can, for example, be a compatible transmitter of a satellite radio-navigation system. To this end, the transmitter 700 can be embedded in the payload of a satellite.

Figure 8:
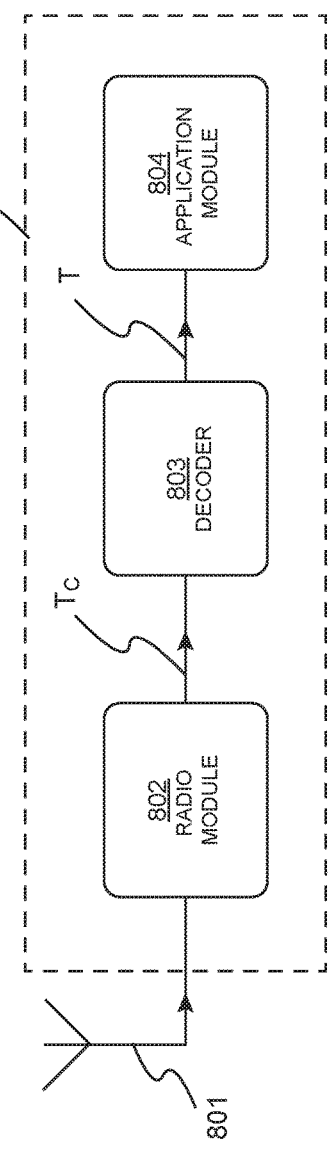

FIG. 8 represents a block diagram of a receiver 800 comprising a decoder 803 according to the invention. The receiver 800 further comprises an antenna 801 for receiving a signal, a radio module 802 for digitally converting, filtering and demodulating the signal and an application module 804 which receives the decoded frames. The receiver 800 can, for example, be a compatible receiver of a satellite radio-navigation system. To this end the receiver 800 can be a GNSS receiver.

The modules of the coder and of the decoder according to the invention can be implemented from hardware and/or software elements. To this end, the invention can notably be implemented as a computer program comprising instructions for the execution thereof. The computer program can be stored on a processor-readable storage medium. The medium can be electronic, magnetic, optical or electromagnetic.

In particular, the invention as a whole or each module of the coder or of the decoder according to the invention can be implemented by a device comprising a processor and a memory. The processor can be a generic processor, a dedicated processor, an application-specific integrated circuit (also known by the acronym ASIC), or a field-programmable gate array (also known by the acronym FPGA).

The device can use one or more dedicated electronic circuits or a general-purpose circuit. The technique of the invention can be implemented on a reprogrammable computation machine (a processor or a microcontroller for example) executing a program comprising a sequence of instructions, or on a dedicated computation machine (for example a set of logic gates like an FPGA or an ASIC, or any other hardware module).

According to one embodiment, the device comprises at least one computer-readable storage medium (RAM, ROM, EEPROM, flash memory or any other memory technology, CD-ROM, DVD or another optical disc medium, magnetic cassette, magnetic tape, magnetic storage disc or another storage device or another non-transient computer-readable storage medium) coded with a computer program (that is to say a number of executable instructions) which, when it is executed on a processor or a number of processors, performs the functions of the embodiments of the invention described previously.

By way of example of a hardware architecture suitable for implementing the invention, a device according to the invention can comprise a communication bus to which are linked a central processing unit or microprocessor (CPU), a read-only memory (ROM) that can include the programs necessary for the implementation of the invention; a random access memory or cache memory (RAM) comprising registers suitable for storing variables and parameters created and modified during the execution of the abovementioned programs; and a communication or I/O interface (I/O being the acronym for "Input/Output") suitable for transmitting and receiving data.

The reference to a computer program which, when it is run, performs any one of the functions described previously, is not limited to an application program running on a single host computer. On the contrary, the terms computer program and software are used here in a general sense to refer to any type of computer code (for example, application software, micro software, micro code, or any other form of computer instruction) which can be used to program one or more processors to implement aspects of the techniques described here. The computing means or resources can notably be distributed (Cloud computing), possibly according to peer-to-peer technologies. The software code can be executed on any appropriate processor (for example, a microprocessor) or processor core or a set of processors, whether provided in a single computation device or distributed between a plurality of computation devices (for example as are possibly accessible in the environment of the device). The executable code of each program allowing the programmable device to implement the processes according to the invention can be stored, for example, on a hard disc or in read-only memory. In general, the program or programs will be able to be loaded into one of the storage means of the device before being executed. The central processing unit can control and direct the execution of the instructions or portions of software code of the program or programs according to the invention, instructions which are stored on the hard disc or in the read-only memory or else in the other abovementioned storage elements.

REFERENCES

[1] "Channel codes, classical and modern", William E. Ryan, Shu Lin, Cambridge university press.

The invention claimed is:
1. A coding method with differentiated protection applied to a frame comprising a set of bits, the coding being performed at least from a first systematic correcting code, represented by a bipartite graph, called Tanner graph, comprising a plurality of first nodes, called variable nodes, said graph further comprising a plurality of second nodes, called check nodes, each variable node being connected to at least one check node by a branch, the number of branches of a variable node being called degree of the variable node, wherein each variable node is associated with a bit of a word of said first code, the variable nodes associated with the systematic bits of the word of the first code being called systematic variable nodes, said method comprising the following steps:
 decomposing the frame into a plurality of subframes, each having a different priority level,
 applying to each subframe, except for the subframe of lowest priority level, a second algebraic correcting code of predetermined efficiency,
 determining said predetermined efficiency as increasing when the priority level of each subframe decreases when the number of subframes is at least equal to three,
 applying an interleaving of the bits of all the subframes so as to perform a correlation between the systematic variable nodes of said first systematic correcting code, arranged according to the value of their degree, and the bits of each subframe, the subframes being arranged according to their priority level, and coding, using the first systematic correcting code, the frame composed of the interleaved bits of all the concatenated subframes.

2. The coding method with differentiated protection of claim 1, wherein the bits of each subframe are correlated with the systematic variable nodes of said first systematic correcting code, arranged in ascending order of the value of their degree according to a descending order of the priority levels of the subframes.

3. The coding method with differentiated protection of claim 1, wherein the bits of each subframe are correlated with the systematic variable nodes of said first systematic correcting code, arranged in ascending order of the value of their degree according to an ascending order of the priority levels of the subframes.

4. The coding method with differentiated protection of claim 3, wherein the first systematic correcting code is constructed such that the proportion of systematic variable nodes of a degree equal to the maximum degree is equal to the ratio between the number of bits of the subframe of highest priority level and the number of bits of a word of said first systematic correcting code.

5. The coding method with differentiated protection of claim 1, wherein the decomposition of the frame into subframes is performed by re-ordering the bits of the frame according to their priority level.

6. The coding method with differentiated protection of claim 5, wherein the priority level of a bit is defined as a function of the criticality of the information associated with the bit, of the weight of the bit or of the refresh frequency of the information associated with the bit.

7. The coding method with differentiated protection of claim 6, wherein the data transmitted in the frame are data of a satellite navigation message generated by a satellite radio-navigation system.

8. The coding method with differentiated protection of claim 1, wherein the second algebraic correcting code is a BCH code.

9. A decoding method with differentiated protection applied to a coded frame comprising a set of bits coded using the coding method with differentiated protection according to claim 1, the decoding method comprising the following steps:
performing a first decoding of the coded frame using a first decoding algorithm of a first systematic correcting code based on the use of a bipartite graph, so as to obtain a first decoded frame,
decomposing the first decoded frame into subframes, each subframe containing the bits corresponding to the systematic variable nodes arranged according to the value of their degree, the subframes being arranged according to their priority level,
performing a second decoding of each subframe, except the frame of lowest priority level, using a second decoding algorithm of a second algebraic correcting code of predetermined efficiency, and
determining said predetermined efficiency as increasing when the priority level of each subframe decreases, when the number of subframes is at least equal to three.

10. The decoding method with differentiated protection of claim 9, further comprising a step of concatenation of the subframes in a second decoded frame.

11. The decoding method with differentiated protection of claim 9, wherein the second correcting code is an error correcting and detecting code, said decoding method further comprising the following steps:
during the second decoding of each subframe, detecting whether the subframe is correctly decoded or not,
if the subframe is correctly decoded,
i. coding with said second algebraic correcting code, each decoded subframe to obtain a coded subframe,
ii. applying a second iteration of the first decoding by specifying, to the decoding algorithm of said first systematic correcting code, a maximum likelihood for said bits of each coded subframe.

12. The decoding method with differentiated protection of claim 9, wherein the second algebraic correcting code is a BCH code.

13. The decoding method with differentiated protection of claim 9, wherein the decoding of said first systematic correcting code and the decoding of the second algebraic correcting code are performed jointly.

14. A coding device with differentiated protection, the coding being applied to a frame comprising a set of bits, the coding being performed at least from a first systematic correcting code represented by a bipartite graph, called Tanner graph, comprising a plurality of first nodes, called variable nodes, said graph further comprising a plurality of second nodes, called check nodes, each variable node being connected to at least one check node by a branch, the number of branches of a variable node being called degree of the variable node, wherein each variable node is associated with a bit of a word of said first code, the variable nodes associated with the systematic bits of the word of the first code being called systematic variable nodes, the coding device being configured to execute the following steps:
decomposing the frame into a plurality of subframes, each having a different priority level,
applying to each subframe, except for the subframe of lowest priority level, a second algebraic correcting code of predetermined efficiency,
determining said predetermined efficiency as increasing when the priority level of each subframe decreases when the number of subframes is at least equal to three,
applying an interleaving of the bits of all the subframes so as to perform a correlation between the systematic variable nodes of said first systematic correcting code, arranged according to the value of their degree, and the bits of each subframe, the subframes being arranged according to their priority level, and
coding, using the first systematic correcting code, the frame composed of the interleaved bits of all the concatenated subframes.

15. A satellite radio-navigation signal transmitter comprising a coding device according to claim 14 for coding, in a differentiated manner, satellite radio-navigation messages.

16. A decoding device with differentiated protection, the decoding being applied to a coded frame comprising a set of bits coded using a coding, the decoding device being configured to execute the steps of:
performing a first decoding of the coded frame using a first decoding algorithm of a first systematic correcting code based on the use of a bipartite graph, to obtain a first decoded frame,
decomposing the first decoded frame into subframes, each subframe containing the bits corresponding to the systematic variable nodes arranged according to the value of their degree, the subframes being arranged according to their priority level,
performing a second decoding of each subframe, except the frame of lowest priority level, using a second decoding algorithm of a second algebraic correcting code of predetermined efficiency, and determining said efficiency as increasing when the priority level of each subframe decreases, when the number of subframes is at least equal to three.

17. A satellite radio-navigation signal receiver comprising a decoding device according to claim 16 for decoding, in a differentiated manner, satellite radio-navigation messages.

* * * * *